(12) United States Patent
Suzuki et al.

(10) Patent No.: US 10,746,931 B2
(45) Date of Patent: Aug. 18, 2020

(54) LIGHT SOURCE DEVICE AND PROJECTOR

(71) Applicant: SEIKO EPSON CORPORATION, Tokyo (JP)

(72) Inventors: Junichi Suzuki, Matsumoto (JP); Hidefumi Sakata, Tatsuno-machi (JP); Yuichiro Iwama, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/523,386

(22) Filed: Jul. 26, 2019

(65) Prior Publication Data
US 2020/0033536 A1    Jan. 30, 2020

(30) Foreign Application Priority Data
Jul. 27, 2018    (JP) .................. 2018-141680

(51) Int. Cl.
| | | |
|---|---|---|
| *F21V 7/04* | (2006.01) | |
| *G02B 6/293* | (2006.01) | |
| *F21V 8/00* | (2006.01) | |
| *H01L 33/50* | (2010.01) | |

(52) U.S. Cl.
CPC ....... *G02B 6/29316* (2013.01); *G02B 6/0018* (2013.01); *G02B 6/0068* (2013.01); *H01L 33/502* (2013.01); *H01L 33/505* (2013.01); *H01L 33/507* (2013.01)

(58) Field of Classification Search
CPC ........ F21K 9/61–64; G02B 6/00–0093; G02B 6/293–29329; G03B 21/00; H01L 33/50–508
USPC ........... 362/311.02, 555, 608, 610, 612–613, 362/615–616, 621–622
See application file for complete search history.

(56) References Cited

U.S. PATENT DOCUMENTS

| | | |
|---|---|---|
| 7,982,229 B2 | 7/2011 | Bechtel et al. |
| 9,921,353 B2 | 3/2018 | Hikmet et al. |
| 2007/0280622 A1 | 12/2007 | Rutherford |
| 2016/0266297 A1 | 9/2016 | Hikmet et al. |

(Continued)

FOREIGN PATENT DOCUMENTS

| | | |
|---|---|---|
| JP | 2017-536664 A | 12/2017 |
| WO | 2017/067781 A1 | 4/2017 |
| WO | 2017/102439 A1 | 6/2017 |

OTHER PUBLICATIONS

Dec. 4, 2019 Extended Search Report issued in European Patent Application No. 19188312.3.

*Primary Examiner* — Jason M Han
(74) *Attorney, Agent, or Firm* — Oliff PLC

(57) ABSTRACT

A light source device includes a light source emitting first light in a first wavelength band, a light guide section guiding partial light of the first light, a wavelength conversion section including a phosphor, which other partial light of the first light, and which converts the other partial light into second light in a second wavelength band. A light guide section first side surface and a wavelength conversion section second side surface are opposed. The first side surface has a diffraction grating. The partial light enters the light guide section from the first side surface via the diffraction grating. The other partial light enters the wavelength conversion section from the second side surface. The partial and second lights are emitted in one of a normal direction of the first end surface of the light guide section and a normal direction of the third end surface of the wavelength conversion section.

11 Claims, 9 Drawing Sheets

(56) References Cited

U.S. PATENT DOCUMENTS

2016/0291232 A1 10/2016 Hikmet et al.
2017/0315433 A1 11/2017 Ronda et al.

LIGHT SOURCE DEVICE AND PROJECTOR

The present application is based on, and claims priority from JP Application Serial Number 2018-141680, filed Jul. 27, 2018, the disclosure of which is hereby incorporated by reference herein in its entirety.

BACKGROUND

1. Technical Field

The present disclosure relates to a light source device and a projector.

2. Related Art

As a light source device used for a projector, there is proposed a light source device using fluorescence emitted from a phosphor when irradiating the phosphor with excitation light emitted from a light emitting element. In JP-T-2017-536664 (Document 1; the term "JP-T" as used herein means a published Japanese translation of a PCT patent application), there is disclosed an illumination device provided with a ceramic body shaped like a rod having a wavelength conversion function, and a light emitting diode (LED) for emitting excitation light, and having a configuration of making the excitation light enter the ceramic body from a side surface, and taking out the converted light from an end surface of the ceramic body.

As described in Document 1, by making the light emitted from the LED enter a wavelength conversion member, it is possible to obtain light different in wavelength from the light emitted from. the LED. When, for example, the wavelength conversion member includes a yellow phosphor, it is possible to obtain yellow light from blue light emitted from the LED. However, in order to obtain white light necessary for a light source device for a projector, it is necessary to separately provide a light source for emitting the blue light, and an optical system such as a light combining element for combining the blue light and the yellow light with each other in addition to the illumination device of Document 1. As a result, there is a problem that the light source device grows in size. Further, also when obtaining colored light other than the white light, there is a problem that the light source device grows in size due to the optical system for combining the fluorescence and other colored light with each other.

SUMMARY

A light source device according to an aspect of the present disclosure includes a light source configured to emit first light in a first wavelength band, a light guide section which partial light of the first light emitted from the light source enters, and which guides the partial light, and a wavelength conversion section which includes a phosphor, which other partial light of the first light emitted from the light source enters, and which converts the other partial light into second light in a second wavelength band different from the first wavelength band. The light guide section has a first end surface and a second end surface opposed to each other, and a first side surface crossing the first end surface and the second end surface. The wavelength conversion section has a third end surface and a fourth end surface opposed to each other, and a second side surface crossing the third end surface and the fourth end surface. The first side surface of the light guide section and the second side surface of the wavelength conversion section are disposed so as to be opposed to each other, the first side surface is provided with a diffraction grating, the partial light enters the light guide section from the first side surface via the diffraction grating, the other partial light enters the wavelength conversion section from the second side surface, and the partial light and the second light are emitted in one of a normal direction of the first end surface of the light guide section and a normal direction of the third end surface of the wavelength conversion section.

In the light source device according to the aspect of the present disclosure, the partial light entering the light guide section with an incident angle smaller than a critical angle may be diffracted by the diffraction grating with a diffraction angle no smaller than the critical angle.

In the light source device according to the aspect of the present disclosure, the light source may include a first light emitting diode which is disposed so as to be opposed to the first side surface of the light guide section, and which emits the partial light, and a second light emitting diode which is disposed so as to be opposed to the second side surface of the wavelength conversion section, and which emits the other partial light.

In the light source device according to the aspect of the present disclosure, the diffraction grating may be disposed at a position opposed to a light irradiation area of the first light emitting diode in the first side surface of the light guide section.

In the light source device according to the aspect of the present disclosure, the diffraction grating may fail to be disposed in an area between the light irradiation area and the first end surface in the first side surface of the light guide section.

The light source device according to the aspect of the present disclosure may further include a light combining element, wherein the light guide section may have a first reflection section provided to the second end surface, the wavelength conversion section may have a second reflection section provided to the fourth end surface, the light combining element may combine the partial light emitted from the first end surface of the light guide section and the second light emitted from the third end surface of the wavelength conversion section with each other, and the partial light and the second light may be emitted from the light combining element.

The light source device according to the aspect of the present disclosure may further include a light guide member, wherein the wavelength conversion section may have a reflection section provided to the third end surface, the light guide member may be disposed so as to be opposed to the fourth end surface of the wavelength conversion section and the second end surface of the light guide section, and may guide at least the second light emitted from the fourth end surface of the wavelength conversion section to the second end surface of the light guide section, and the partial light and the second light may be emitted from the first end surface of the light guide section.

In the light source device according to the aspect of the present disclosure, the first wavelength band may be a blue wavelength band, and the second wavelength band may be a yellow wavelength band.

The light source device according to the aspect of the present disclosure may further include a second wavelength conversion section which has a fifth end surface and a sixth end surface opposed to each other, and a third side surface crossing the fifth end surface and the sixth end surface, and which converts the other partial light into third light in a third wavelength band different from the first wavelength band and the second wavelength band, and a light combining element configured to combine the partial light emitted from the first surface of the light guide section, the second light emitted from the third end surface of the wavelength conversion section, and the third light emitted from the fifth end surface of the second wavelength conversion section with each other, wherein the light guide section may have a first reflection section provided to the second end surface, the wavelength conversion section may have a second reflection section provided to the fourth end surface, the second wavelength conversion section may have a third reflection section provided to the sixth end surface, and the partial light, the second light and the third light may be emitted from the light combining element.

In the light source device according to the aspect of the present disclosure, the first wavelength band may be a blue wavelength band, the second wavelength band may be a green wavelength band, and the third wavelength band may be a red wavelength band.

A projector according to another aspect of the present disclosure includes the light source device according to any one of the above aspects of the present disclosure, a light modulation device configured to modulate light from the light source device in accordance with image information, and a projection optical device configured to project the light modulated by the light modulation device.

DESCRIPTION OF EXEMPLARY EMBODIMENTS

First Embodiment

Hereinafter, a first embodiment of the present disclosure will be described using FIG. 1 through FIG. 7.

The projector according to the present embodiment is an example of a projector using a liquid crystal panel as a light modulation device.

It should be noted that in each of the drawings described below, the constituents are shown with the scale ratios of respective sizes set differently between the constituents in some cases in order to facilitate the visualization of each of the constituents.

Figure 1:
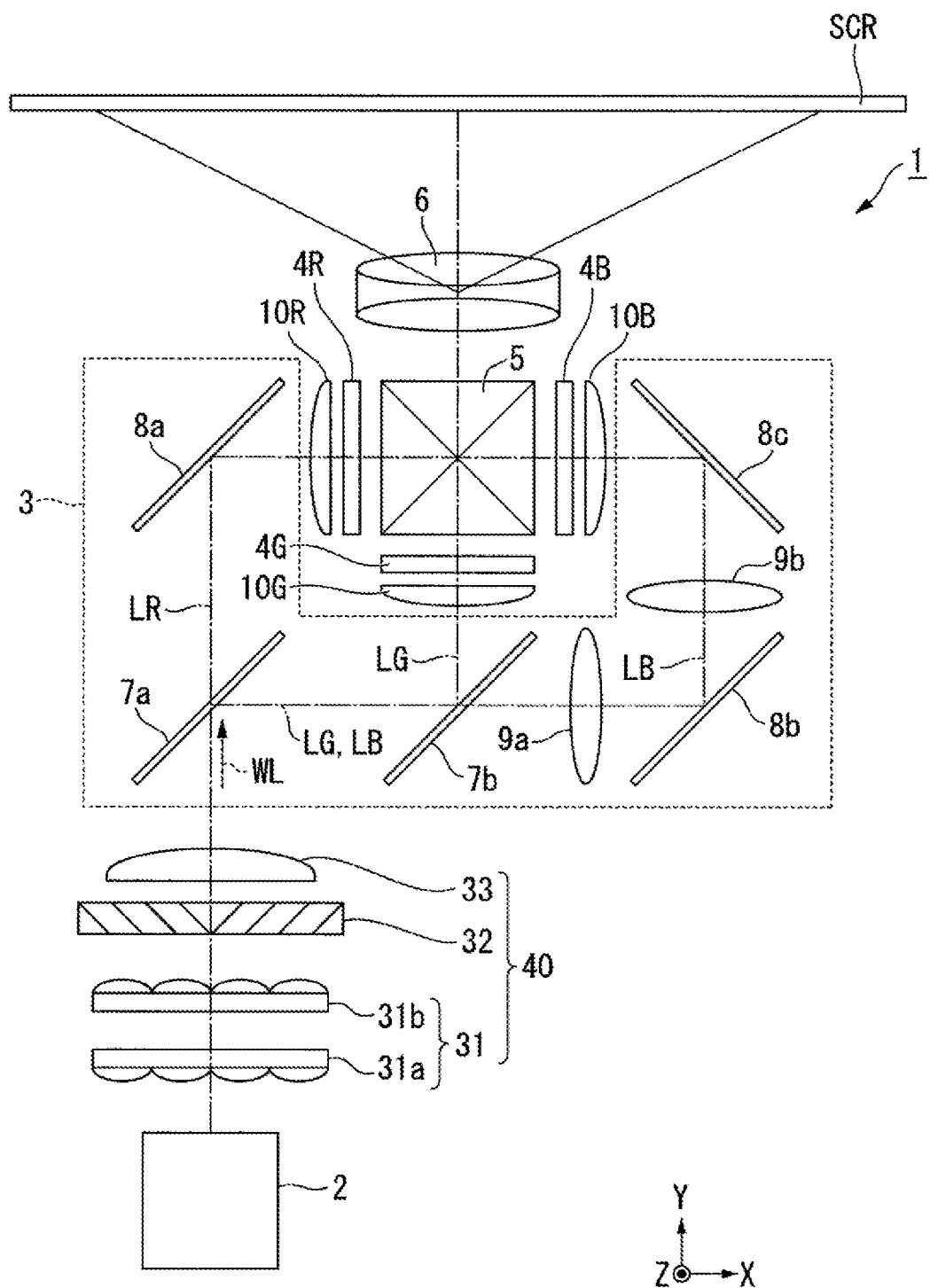
FIG. 1 is a schematic configuration diagram of a projector according to a first embodiment.

FIG. 1 is a schematic configuration diagram of the projector 1 according to the first embodiment.

The projector 1 according to the first embodiment is a projection-type image display device for projecting a color image on a screen (a projection target surface) SCR. The projector 1 uses three light modulation devices corresponding to respective colored light, namely red light LR, green light LG and blue light LB.

As shown in FIG. 1, the projector 1 is provided with a light source device 2, a homogenous illumination optical system 40, a color separation optical system 3, a light modulation device 4R, a light modulation device 4G, a light modulation device 4B, a combining optical system 5, and a projection optical device 6.

The light source device 2 emits illumination light WL toward the homogenous illumination optical system 40. The detailed configuration of the light source device 2 will be described later in detail.

The homogenous illumination optical system 40 is provided with an integrator optical system 31, a polarization conversion element 32, and a superimposing optical system 33. The integrator optical system 31 is provided with a first lens array 31a and a second lens array 31b. The homogenous illumination optical system 40 homogenizes the intensity distribution of the illumination light WL emitted from the light source device 2 in each of the light modulation device 4R, the light modulation device 4G and the light modulation device 4B as illumination target areas. The illumination light WL having been emitted from the homogenous illumination optical system 40 enters the color separation optical system 3.

The color separation optical system 3 separates the illumination light WL as white light into the red light LR, the green light LG and the blue light LB. The color separation optical system 3 is provided with a first dichroic mirror 7a, a second dichroic mirror 7b, a first reflecting mirror 8a, a second reflecting mirror 8b, a third reflecting mirror 8c, a first relay lens 9a and a second relay lens 9b.

The first dichroic mirror 7a separates the illumination light WL from the light source device 2 into the red light LR and the rest of the light (the green light LG and the blue light LB). The first dichroic mirror 7a transmits the red light LR thus separated from, and at the same time reflects the rest of the light (the green light LG and the blue light LB). Meanwhile, the second dichroic mirror 7b separates the rest of the light into the green light LG and the blue light LB. The second dichroic mirror 7b reflects the green light LG thus separated from and transmits the blue light LB.

The first reflecting mirror 8a is disposed in the light path of the red light LR, and reflects the red light LR, which has been transmitted through the first dichroic mirror 7a, toward the light modulation device 4R. Meanwhile, the second reflecting mirror 8b and the third reflecting mirror 8c are disposed in the light path of the blue light LB, and reflect the blue light LB, which has been transmitted through the second dichroic mirror 7b, toward the light modulation device 4B. Further, the green light LG is reflected by the second dichroic mirror 7b toward the light modulation device 4G.

The first relay lens 9a and the second relay lens 9b are disposed on the light exit side of the second dichroic mirror 7b in the light path of the blue light LB. The first relay lens 9a and the second relay lens 9b correct a difference in illuminance distribution of the blue light LB due to the fact that the blue light LB is longer in optical path length than the red light LR and the green light LG.

The light modulation device 4R modulates the red light LR in accordance with image information to form image light corresponding to the red light LR. The light modulation device 4G modulates the green light LG in accordance with the image information to form image light corresponding to the green light LG. The light modulation device 4B modulates the blue light LB in accordance with the image information to form image light corresponding to the blue light LB.

As the light modulation device 4R, the light modulation device 4G, and the light modulation device 4B, there are used, for example, transmissive liquid crystal panels. Further, on the incident side and the exit side of the liquid crystal panel, there are disposed a pair of polarization plates (not shown), respectively, and thus, there is formed a configuration of transmitting only the linearly polarized light with a specific direction.

On the incident side of the light modulation device 4R, the light modulation device 4G, and the light modulation device 4B, there are disposed a field lens 10R, a field lens 10G, and a field lens 10B, respectively. The field lens 10R, the field lens 10G, and the field lens 10B collimate principal rays of the red light LR, the green light LG, and the blue light LB entering the light modulation device 4R, the light modulation device 4G, and the light modulation device 4B, respectively.

The combining optical system 5 combines the image light corresponding to the red light LR, the image light corresponding to the green light LG, and the image light corresponding to the blue light LB with each other in response to incidence of the image light from the light modulation device 4R, the light modulation device 4G, and the light modulation device 4B, and then emits the image light thus combined toward the projection optical device 6. As the combining optical system 5, there is used, for example, a cross dichroic prism.

The projection optical device 6 is constituted by a plurality of projection lenses. The projection optical device 6 projects the image light having been combined by the combining optical system 5 toward the screen SCR in an enlarged manner. Thus, an image is displayed on the screen SCR.

The light source device 2 will hereinafter be described.

Figure 2:
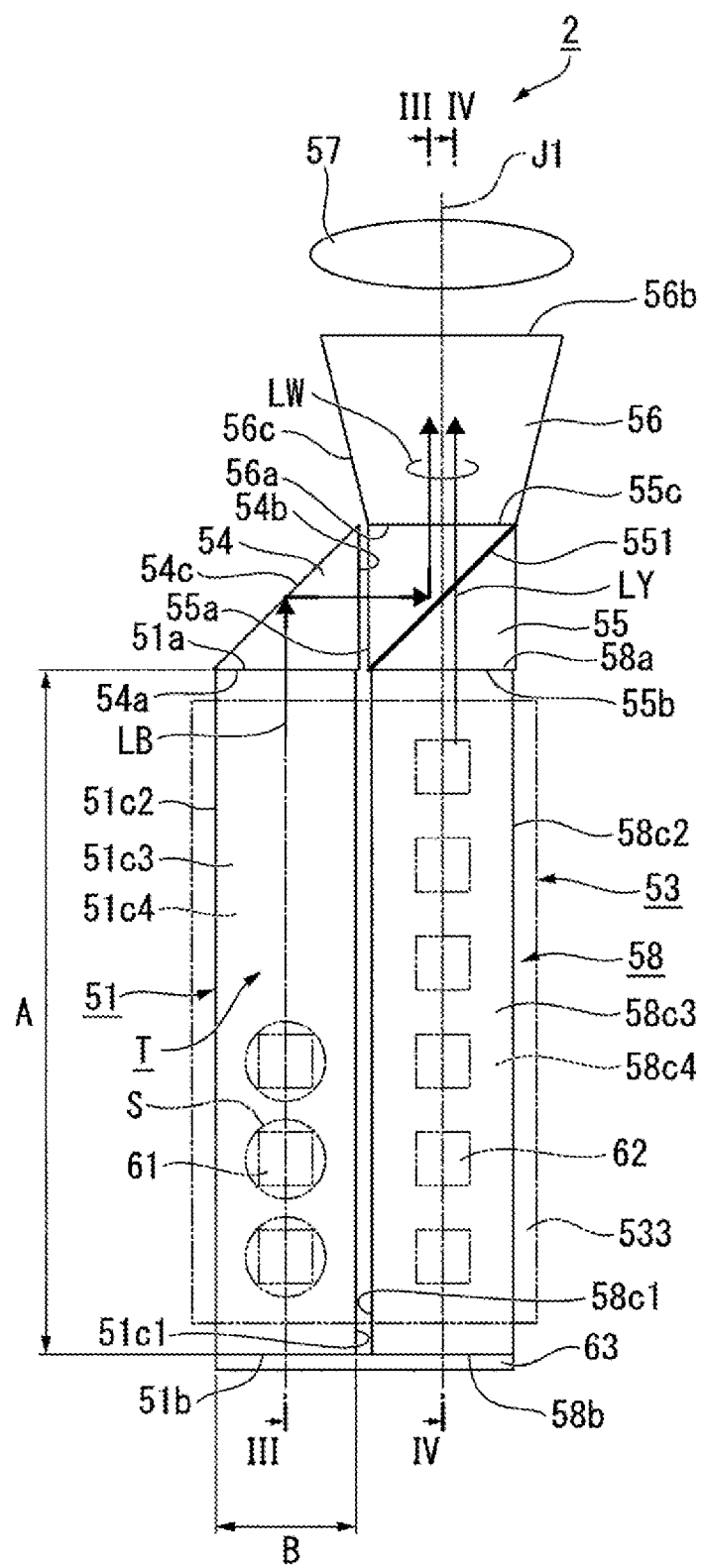
FIG. 2 is a schematic configuration diagram of a light source device according to the first embodiment.
Figure 3:
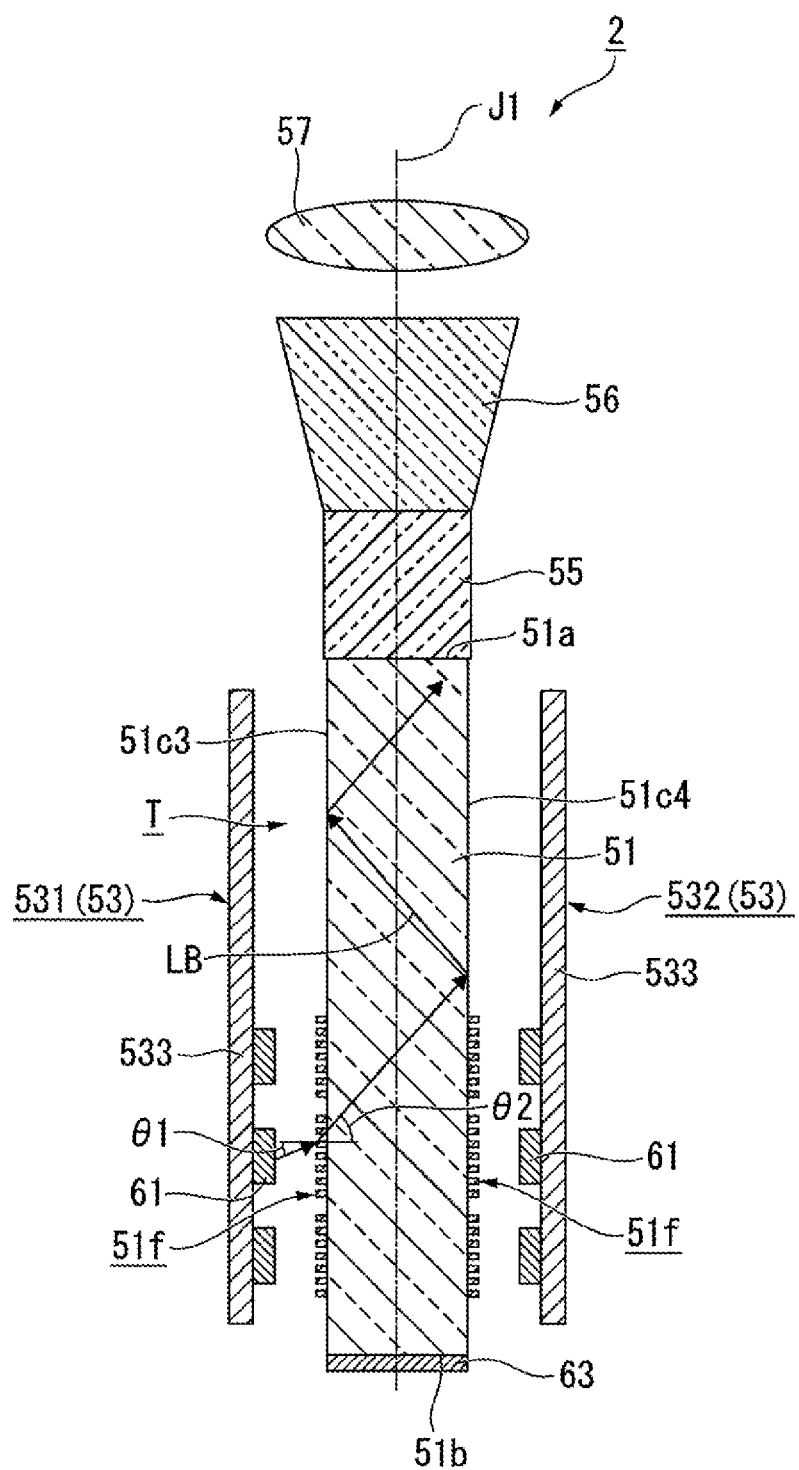
FIG. 3 is a cross-sectional view of the light source device along the line shown in FIG. 2.
Figure 4:
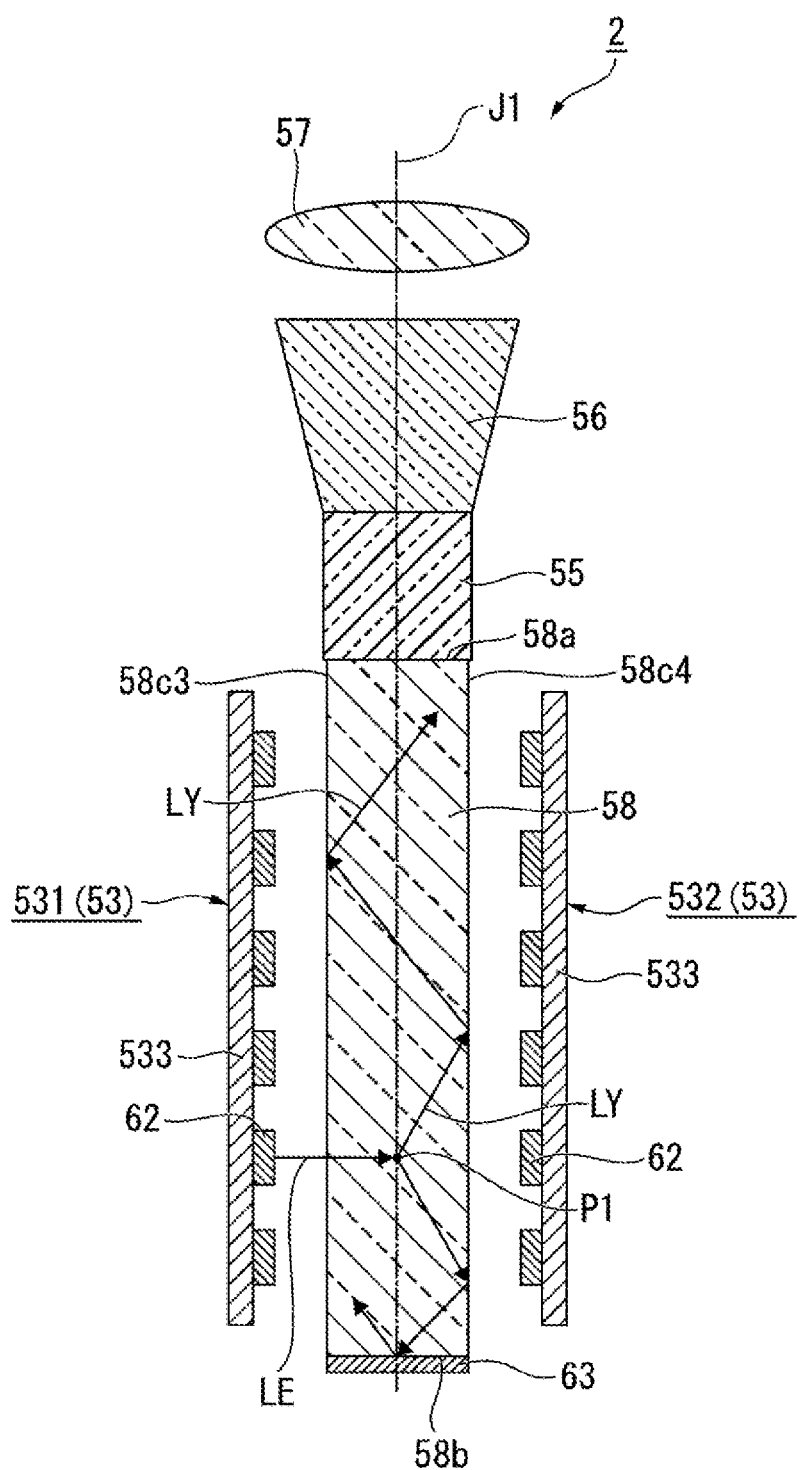
FIG. 4 is a cross-sectional view of the light source device along the line IV-IV shown in FIG. 2.

FIG. 2 is a schematic configuration diagram of the light source device 2. FIG. 3 is a cross-sectional view of the light source device along the line shown in FIG. 2. FIG. 4 is a cross-sectional view of the light source device along the line IV-IV shown in FIG. 2.

As shown in FIG. 2, the light source device 2 is provided with a light guide rod 51 (a light guide section), a wavelength conversion rod 58 (a wavelength conversion section), a light source 53, a prism 54, a light combining element 55, an angle conversion element 56 and a collimator lens 57.

The light source device 2 according to the first embodiment has a single wavelength conversion rod 58 including at least a phosphor. A part of the light in a first wavelength band emitted from the light source 53 enters the wavelength conversion rod 58, and is converted by the wavelength conversion rod 58 into second light in a second wavelength band different from the first wavelength band.

The light guide rod 51 has a shape of a quadrangular prism, and has a first end surface 51a and a second end surface 51b opposed to each other, and four side surfaces 51c1, 51c2, 51c3 and 51c4 crossing the first end surface 51a and the second end surface 51b. The whole of the four side surfaces 51c1, 51c2, 51c3 and 51c4 corresponds to a first side surface in the appended claims. Similarly, the wavelength conversion rod 58 has a shape of a quadrangular prism, and has a third end surface 58a and a fourth end surface 58b opposed to each other, and four side surfaces 58c1, 58c2, 58c3 and 58c4 crossing the third end surface 58a and the fourth end surface 58b. The whole of the four side surfaces 58c1, 58c2, 58c3 and 58c4 corresponds to a second side surface in the appended claims. An axis passing through the center of the third end surface 58a and the center of the fourth end surface 58b of the wavelength conversion rod 58 is defined as an optical axis J1 of the light source device 2. The light from the light source device 2 is emitted in a direction of the optical axis J1.

In the present embodiment, the light guide rod 51 and the wavelength conversion rod 58 have substantially the same dimensions. The dimension A in the longitudinal direction (a normal direction of the first end surface 51a) of the light guide rod 51 is longer than a dimension B in the width direction (a normal direction of the side surface 51c) of the light guide rod 51. For example, the dimension A is roughly ten through several tens times as large as the dimension B. The same as the light guide rod 51 applies to the wavelength conversion rod 58.

It should be noted that each of the light guide rod 51 and the wavelength conversion rod 58 is not necessarily required to have the shape of a quadrangular prism, but can also have an other polygonal shape such as a triangular prism. Alternatively, it is also possible for each of the light guide rod 51 and the wavelength conversion rod 58 to have a columnar shape. When each of the light guide rod 51 and the wavelength conversion rod 58 has a columnar shape, the light guide rod 51 has the first end surface 51a, the second end surface 51b which is parallel to the first end surface 51a, and the first side surface perpendicular to the first end surface and the second end surface, and the wavelength conversion rod 58 has the third end surface 58a, the fourth end surface 58b which is parallel to the third end surface 58a, and the second side surface perpendicular to the third end surface and the fourth end surface.

The light guide rod 51 and the wavelength conversion rod 58 are disposed at a distance in an orientation in which the side surface 51c1 of the light guide rod 51 and the side surface 58c1 of the wavelength conversion rod 58 are opposed to each other. Hereinafter, for the sake of convenience of explanation, the end surface on the side where the light is emitted from the light guide rod 51 is referred to as the first end surface 51a, and the end surface facing to the opposite side to the first end surface 51a is referred to as the second end surface 51b. Further, the end surface on the side where the light is emitted from the wavelength conversion rod 58 is referred to as the third end surface 58a, and the end surface facing to the opposite side to the third end surface 58a is referred to as the fourth end surface 58b.

As shown in FIG. 3 and FIG. 4, the light source 53 is provided with a first light source 531 and a second light source 532. As shown in FIG. 2, the first light source 531 is disposed so as to straddle the side surface 51c3 of the light guide rod 51 and the side surface 58c3 of the wavelength conversion rod 58. The second light source 532 is disposed so as to straddle the side surface 51c4 of the light guide rod 51 and the side surface 58c4 of the wavelength conversion rod 58. The light source 53 emits first light in the first wavelength band.

The first light source 531 and the second light source 532 have the same configuration, and are each provided with a substrate 533, and a plurality of light emitting diodes 61, 62 (LED) mounted on one surface of the substrate 533, the one surface being opposed to the light guide rod 51 or the wavelength conversion rod 58. In the present embodiment, each of the light sources is provided with the 9 LED 61, 62, but the number of the LED 61, 62 is not particularly limited. Each of the LED 61, 62 emits the first light in the first wavelength band. The first wavelength band is a blue wavelength of, for example, 400 nm through 480 nm, and the peak wavelength is, for example, 445 nm. Therefore, the first light is blue light. It should be noted that each of the light sources 531, 532 can also be provided with other optical members such as a light guide plate, a diffuser plate or a lens besides the substrate 533 and the LED 61, 62.

The plurality of LED 61 is disposed so as to be opposed to the side surface 51c3 and the side surface 51c4 of the light guide rod 51, and the plurality of LED 62 is disposed so as to be opposed to the side surface 58c3 and the side surface 58c4 of the wavelength conversion rod 58. As shown in FIG. 2, the plurality of LED 61, 62 is arranged in two columns. Some LED 61 are arranged along the longitudinal direction of the light guide rod 51, and other LED 62 are arranged along the longitudinal direction of the wavelength conversion rod 58. Hereinafter, the LED 61 arranged along the longitudinal direction of the light guide rod 51 are referred to as first LED 61, and the LED 62 arranged along the longitudinal direction of the wavelength conversion rod 58 are referred to as second LED 62. The plurality of first LED 61 is disposed at positions far from the first end surface 51a of the light guide rod 51 and near to the second end surface 51b.

The light LB emitted from the first LED 61 propagates inside the light guide rod 51, and is then emitted from the light guide rod 51, and functions as the blue light constituting a part of the illumination light. On the other hand, the light LE emitted from the second LED 62 enters the wavelength conversion rod 58, and then functions as the excitation light for exciting the phosphor in the wavelength conversion rod 58. As described above, since the function of the light LB emitted from the first LED 61 and the function of the light LE emitted from the second LED 62 are different from each other, it is possible for the first LED 61 and the second LED 62 to emit light beams having the wavelengths different from each other so as to be optimized as the blue light and the excitation light, respectively, or emit light beams having the same wavelength used commonly to the both functions.

The light guide rod 51 is formed of a light transmissive material such as glass. The light LB emitted from the first LED 61 of the light source 53 enters the light guide rod 51, and is guided by the light guide rod 51. As shown in FIG. 3, diffraction gratings 51f are disposed on the side surface 51c3 and the side surface 51c4 opposed to the first LED 61 out of the four side surfaces of the light guide rod 51. The diffraction gratings 51f each have a configuration in which a number of concavities and convexities are periodically formed at roughly the same pitch as the wavelength of the light. It is also possible to use the diffraction gratings 51f obtained by directly providing the concavities and the convexities to the light transmissive material constituting the light guide rod 51, or it is also possible to bond the diffraction gratings 51f separately manufactured to the light guide rod 51.

The pattern of the concavities and the convexities of the diffraction grating 51f is designed so that the light entering the light guide rod 51 with an incident angle smaller than the critical angle is diffracted with a diffraction angle equal to or larger than the critical angle. Further, it is desirable for the light transmissive material constituting the light guide rod 51 to have a high refractive index. By using the high-refractive index material, it is possible to enlarge the critical angle of the light propagating inside the light guide rod 51.

In FIG. 2, the circles expressed by the dashed-dotted lines denoted by the reference symbol S are each an area (a light irradiation area) irradiated with the light LB emitted from the first LED 61, and further show the areas where the diffraction gratings 51f are disposed. As described above, the diffraction gratings 51f are disposed so as to correspond to the light irradiation areas S of the first LED 61 in the side surface 51c3 and the side surface 51c4 of the light guide rod 51. Further, since the plurality of first LED 61 is disposed only at positions near to the second end surface 51b of the light guide rod 51, the side surface 51c3 and the side surface 51c4 of the light guide rod 51 each have an area T where the diffraction grating 51f is not disposed, wherein the area T is located closer to the first end surface 51a than the light irradiation areas S. In other words, the diffraction grating 51f is not disposed in an area between the light irradiation areas S and the first end surface 51a in each of the side surface 51c3 and the side surface 51c4 of the light guide rod 51.

The light LE emitted from the second LED 62 of the light source 53 enters the wavelength conversion rod 58, and is converted by the wavelength conversion rod 58 into the second light LY in the second wavelength band different from the first wavelength band. The wavelength conversion rod 58 is formed of a ceramic phosphor (polycrystalline phosphor) for converting the wavelength of the light LE from the second LED 62 into the wavelength of the second light LY in the second wavelength band. The second wavelength band is a yellow wavelength band of, for example, 490 through 750 nm. Therefore, the second light LY is yellow fluorescence. The wavelength conversion rod 58 can also be formed of a single-crystal phosphor instead of the polycrystalline phosphor. Alternatively, the wavelength conversion rod 58 can also be formed of fluorescent glass. Alternatively, the wavelength conversion rod 58 can also be formed of a material obtained by dispersing a number of phosphor particles in a binder made of glass or resin. Therefore, the peak wavelength of the second wavelength band is longer than the peak wavelength of the first wavelength band.

Specifically, the wavelength conversion rod 58 is formed of, for example, an yttrium aluminum garnet (YAG) phosphor. Citing YAG:Ce including cerium (Ce) as an activator agent as an example, as the material of the wavelength conversion rod 58, there can be used a material obtained by mixing raw powder including constituent elements such as $Y_2O_3$, $Al_2O_3$ and $CeO_3$ to cause the solid-phase reaction, Y—Al—O amorphous particles obtained by a wet process such as a coprecipitation process or a sol-gel process, and YAG particles obtained by a gas-phase process such as a spray drying process, a flame heat decomposition process or a thermal plasma process.

The light guide rod 51 has a mirror 63 (a first reflecting section) disposed on the second end surface 51b of the light guide rod 51. The wavelength conversion rod 58 has the mirror 63 (a second reflecting section) disposed on the fourth end surface 58b of the wavelength conversion rod 58. Although in the present embodiment, the common mirror 63 is disposed so as to straddle the light guide rod 51 and the wavelength conversion rod 58 as shown in FIG. 2, it is also possible to provide the mirror individually to the light guide rod 51 and the wavelength conversion rod 58. The mirror 63 is formed of a metal film or a dielectric multilayer film.

As shown in FIG. 2, the prism 54 is disposed on the first end surface 51a of the light guide rod 51. The prism 54 is formed of a prism shaped like a triangular prism having an isosceles right triangular cross-sectional shape, and has an end plane of incidence of light 54a, a reflecting surface 54c and a light exit end surface 54b. The prism 54 has a function of folding the light path of the light LB having entered the prism 54 at an angle of 90° and then emitting the light LB.

In other words, the prism 54 reflects the light LB, which has been emitted from the first end surface 51a of the light guide rod 51, with the reflecting surface 54c to thereby fold the light path, and then emits the light LB from the light exit end surface 54b.

The light combining element 55 is disposed so as to be opposed to the light exit end surface 54b of the prism 54 and the third end surface 58a of the wavelength conversion rod 58. The light combining element 55 is formed of a dichroic prism having a dichroic mirror 551 disposed inside. The light combining element 55 has a rectangular solid shape, and has an end plane of incidence of light 55a and an end plane of incidence of light 55b, and a light exit end surface 55c. The dichroic mirror 551 has a characteristic of reflecting light in the blue wavelength band while transmitting light in the yellow wavelength band. Thus, the light combining element 55 combines the blue light LB emitted from the first end surface 51a of the light guide rod 51 and the yellow fluorescence LY emitted from the third end surface 58a of the wavelength conversion rod 58 with each other. The white composite light LW consisting of the blue light LB and the yellow fluorescence LY is emitted from the light combining element 55.

The angle conversion element 56 is disposed on the light exit side of the light exit end surface 55c of the light combining element 55. The angle conversion element 56 is formed of a taper rod having an end plane of incidence of light 56a which the composite light LW enters, and a light exit end surface 56b from which the composite light LW is emitted. The angle conversion element 56 has a truncated quadrangular pyramid shape, and the cross-sectional area perpendicular to the optical axis J1 increases along the proceeding direction of the composite light LW, and the area of the light exit end surface 56b is larger than the area of the end plane of incidence of light 56a. Thus, the composite light LW changes the angle to the direction parallel to the optical axis J1 every time the composite light LW is totally reflected by the side surface 56c while proceeding inside the angle conversion element 56. In such a manner, the angle conversion element 56 makes the diffusion angle of the composite light LW in the light exit end surface 56b smaller than the diffusion angle of the composite light LW in the end plane of incidence of light 56a.

The angle conversion element 56 is fixed to the light combining element 55 so that the end plane of incidence of light 56a is opposed to the light exit end surface 55c of the light combining element 55. Specifically, the angle conversion element 56 and the light combining element 55 have contact with each other via an optical adhesive (not shown), and no air gap (no air layer) is disposed between the angle conversion element 56 and the light combining element 55. It should be noted that the angle conversion element 56 can also be fixed so as to have direct contact with the light combining element 55 by, for example, an arbitrary support member. In any case, it is desirable not to provide an air gap between the angle conversion element 56 and the light combining element 55. It is desirable to make the refractive index of the angle conversion element 56 and the refractive index of the light combining element 55 coincide with each other as precise as possible.

It should be noted that it is also possible to use a compound parabolic concentrator (CPC) as the angle conversion element 56 instead of the taper rod. In the case of using the CPC as the angle conversion element 56, substantially the same advantages as those when using the taper rod can be obtained.

The collimator lens 57 is disposed on the light exit side of the light exit end surface 56b of the angle conversion element 56. The collimator lens 57 collimates the composite light LW emitted from the angle conversion element 56. Therefore, parallelism of the composite light LW the angle distribution of which is converted by the angle conversion element 56 is further improved by the collimator lens 57. The collimator lens 57 is formed of a convex lens. It should be noted that when sufficient parallelism is obtained by the angle conversion element 56 alone, it is not necessarily required to provide the collimator lens 57.

Hereinafter, the behavior of the light in the light source device 2 having the configuration described above will be described.

As shown in FIG. 3, since the diffraction gratings 51f are disposed on the side surface 51c3 and the side surface 51c4 of the light guide rod 51, the light LB emitted from the first LED 61 enters the light guide rod 51 from each of the side surface 51c3 and the side surface 51c4 via the diffraction gratings 51f. On this occasion, the light LB which enters the light guide rod 51 with the incident angle θ1 smaller than the critical angle is diffracted by the diffraction grating 51f with the diffraction angle θ2 equal to or larger than the critical angle θc. Therefore, θ1<θc≤θ2 is true. Thus, the light path of the light LB entering the light guide rod 51 is folded toward the first end surface 51a, and the light LB proceeds toward the first end surface 51a while repeating the total reflection on the side surfaces of the light guide rod 51.

It should be noted that although there barely exists the light LB which enters the light guide rod 51 and then proceeds toward the second end surface 51b of the light guide rod 51, the light LB is reflected by the mirror 63 disposed on the second end surface 51b, and therefore proceeds toward the first end surface 51a.

Subsequently, as shown in FIG. 2, the light LB, which has been emitted from the first end surface 51a of the light guide rod 51, is reflected by the reflecting surface 54c of the prism 54, and thus, the light path of the light LB is folded, and then the light LB enters the light combining element 55. It should be noted that it is desirable that a gap (an air layer) is provided between the prism 54 and the light combining element 55 so that the prism 54 and the light combining element 55 do not have direct contact with each other. By providing the gap between the prism 54 and the light combining element 55, the light entering the boundary between the prism 54 and the light combining element 55 with the incident angle smaller than the critical angle out of the light proceeding to the vicinity of the boundary can be prevented from being leaked outside the prism 54 or the light combining element 55, and thus, the light use efficiency can be improved.

Meanwhile, as shown in FIG. 4, when the light LE emitted from the second LED 62 enters the wavelength conversion rod 58, the phosphor included in the wavelength conversion rod 58 is excited, and the fluorescence LY is emitted from an arbitrary light emitting point P1. The fluorescence LY proceeds from the arbitrary light emitting point P1 toward all directions, but the fluorescence LY proceeding toward the side surfaces proceeds toward the third end surface 58a or the fourth end surface 58b while repeating the total reflection. The fluorescence LY having proceeded toward the third end surface 58a enters the light combining element 55 from the third end surface 58a. Meanwhile, the fluorescence LY having proceeded toward the fourth end surface 58b is reflected by the mirror 63, and then proceeds toward the third end surface 58a.

As shown in FIG. 2, the light LB having entered the light combining element 55 is reflected by the dichroic mirror 551. Meanwhile, the fluorescence LY having entered the light combining element 55 is transmitted through the dichroic mirror 551. As a result, the blue light LB and the yellow fluorescence LY are combined with each other, and the white composite light LW is emitted from the light exit end surface 55c of the light combining element 55. The composite light LW having been emitted from the light combining element 55 is collimated by the angle conversion element 56 and the collimator lens 57, and is then emitted from the light source device 2. The composite light LW (the illumination light WL) having been emitted from the light source device 2 proceeds toward the integrator optical system 31 as shown in FIG. 1.

In the light source device 2 according to the present embodiment, since the light guide rod 51 for emitting the blue light LB and the wavelength conversion rod 58 for emitting the yellow fluorescence LY are arranged so that the respective side surfaces are opposed to each other, the light combining element 55 is disposed on the third end surface 58a of the wavelength conversion rod 58, and the first light source 531 and the second light source 532 are disposed so as to be opposed to the side surfaces 51c3, 58c3, and the side surfaces 51c4, 58c4 of the light guide rod 51 and the wavelength conversion rod 58, it is possible to realize the light source device small in size and capable of emitting the white light.

Since the light source device 2 according to the present embodiment has the configuration of guiding the light LB emitted from the first LED 61 to the light combining element 55 with the light guide rod 51, it is possible to efficiently obtain the blue light with a simple configuration without separately preparing the phosphor light source capable of emitting the blue light such as a combination of the ultraviolet LED and the blue phosphor. Further, since the light LB is folded inside the light guide rod 51 toward the first end surface 51a using the diffraction gratings 51f, it is possible to efficiently use the blue light in this regard.

Assuming that the diffraction grating is disposed throughout the entire area of each of the side surfaces of the light guide rod, there is a possibility that the blue light propagating inside the light guide rod is leaked outside the light guide rod through the diffraction grating when the blue light enters the diffraction grating. In this regard, according to the light source device 2 related to the first embodiment, since the diffraction gratings 51f are selectively disposed at positions corresponding respectively to the light irradiation areas S of the first LED 61, and the diffraction grating 51f is not disposed in the area between the light irradiation area S and the first end surface 51a, there is a low possibility that the light LB propagating inside the light guide rod 51 is leaked outside the light guide rod 51, and thus, it is possible to efficiently use the light LB.

Further, in general, the light emitted from the LED is larger in diffusion angle compared to the light emitted form the semiconductor laser. Therefore, the light source using the LED is large in etendue determined by the product of the light emitting area of the light source and the solid angle of the light from the light source compared to the light source using the semiconductor laser. The increase in etendue of the light source device increases the light which cannot be taken by the optical system in the posterior stage of the light source device to cause deterioration of the light use efficiency as the projector. Therefore, when used as the light source device for the projector, it is desirable for the etendue to be as small as possible.

From that point of view, in the case of the light source device 2 according to the present embodiment, the light source 53 is constituted by the first LED 61 and the second LED 62, and the light large in diffusion angle emitted from each of the LED enters the light guide rod 51 or the wavelength conversion rod 58 from the side surface large in the area. Meanwhile, the white composite light LW consisting of the light LB from the light guide rod 51 and the fluorescence LY from the wavelength conversion rod 58 is emitted from the light exit end surface 55c of the light combining element 55 having a size corresponding to the end surface sufficiently smaller in the area compared to the side surface of the rod. As described above, according to the present embodiment, it is possible to substantively decrease the light emitting area, and thus it is possible to realize the light source device 2 small in etendue. As a result, by using this light source device 2 in the projector 1, it is possible to improve the light use efficiency in the optical system in the posterior stage of the light source device 2.

In the case of the present embodiment, since the blue light LB is emitted from the light guide rod 51, the yellow fluorescence LY is emitted from the wavelength conversion rod 58, and the white light can be obtained by combining the blue light LB and the yellow fluorescence LY with each other, by controlling the balance between the light intensity of the light LB and the light intensity of the fluorescence LY, it is possible to control the white balance of the white light. As a specific adjustment method of the white balance, it is also possible to adopt a configuration in which, for example, the light source device 2 is provided with sensors for detecting the light intensities of the light LB and the fluorescence LY, and the electrical power to be supplied to the first LED 61 or the second LED 62 is appropriately controlled in accordance with the deviation of each of the light intensities detected by the sensors from a standard value. Further, as the adjustment method of the white balance in the design phase, it is possible to control the number of the first LED 61 or the second LED 62, or it is also possible to control the length or the thickness of the light guide rod 51 or the wavelength conversion rod 58.

In the light source device 2 related to the present embodiment, since the angle conversion element 56 is disposed on the light exit side of the light combining element 55, it is possible to collimate the composite light LW emitted from the light combining element 55. Further, since the collimator lens 57 is disposed on the light exit side of the angle conversion element 56, it is possible to further improve the parallelism of the composite light LW. Thus, it is possible to improve the light use efficiency in the optical system in the posterior stage of the light source device 2.

In the light source device 2 of the present embodiment, since the mirror 63 is disposed on the second end surface 51b of the light guide rod 51 and the fourth end surface 58b of the wavelength conversion rod 58, the light LB and the fluorescence LY can be prevented from being emitted from the side of the second end surface 51b and the fourth end surface 58b. Thus, the use efficiency of the light LB and the fluorescence LY can be improved.

It is also possible to dispose a reflecting film formed of, for example, a metal film between the side surface 51c1 of the light guide rod 51 and the side surface 58c1 of the wavelength conversion rod 58 instead of the gap (the air layer). It should be noted that when a reflecting film formed of a metal film is disposed between the light guide rod 51 and the wavelength conversion rod 58, there is a problem that a light loss occurs when the light propagating inside each of the rods is reflected by the reflecting film, and the larger the number of times of the reflection of the light is made for improving the illuminance homogeneity of the light, the larger the light loss becomes.

In contrast, according to the light source device 2 related to the present embodiment, since the gap (the air layer) is disposed between the light guide rod 51 and the wavelength conversion rod 58, the reflection of the light in the first side surfaces 51c1, 58c1 of the respective rods 51, 58 becomes the total reflection not accompanied with the light loss. Thus, the light use efficiency can be improved. From that point of view, it is desirable to avoid providing the side surfaces other than the first side surfaces 51c1, 58c1 with the reflecting film if at all possible.

The projector 1 according to the present embodiment is equipped with the light source device 2 described above, and is therefore excellent in light use efficiency, and at the same time, reduction is size can be achieved.

It should be noted that it is also possible for the light guide rod 51 and the light source 53 in the present embodiment to have the configuration described below.

First Modified Example

Figure 5:
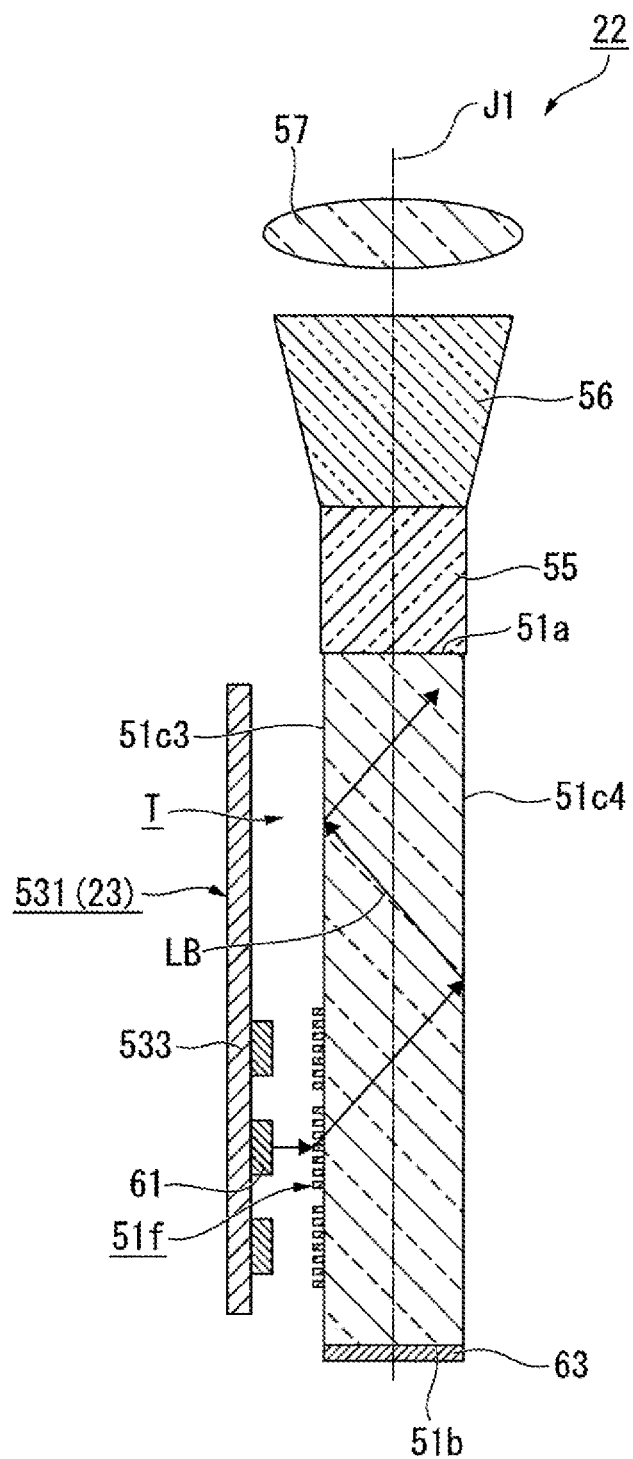
FIG. 5 is a cross-sectional view of a light source device according to a first modified example.

FIG. 5 is a cross-sectional view of a light source device 22 according to a first modified example, and corresponds to a cross-sectional view at the same position as in FIG. 3. Therefore, in FIG. 5, the constituents common to those shown in FIG. 3 are denoted by the same reference numerals, and the description thereof will be omitted.

As shown in FIG. 5, in the light source device 22 according to the first modified example, a light source 23 is provided with the first light source 531 having the first LED 61 opposed to the side surface 51c3 of the light guide rod 51. Further, the light source 23 is not disposed on the side opposed to the side surface 51c4 of the light guide rod 51. The diffraction gratings 51f are disposed on the side surface 51c3 of the light guide rod 51 so as to correspond to the arrangement of the first LED 61, but are not disposed on the side surface 51c4.

Second Modified Example

Figure 6:
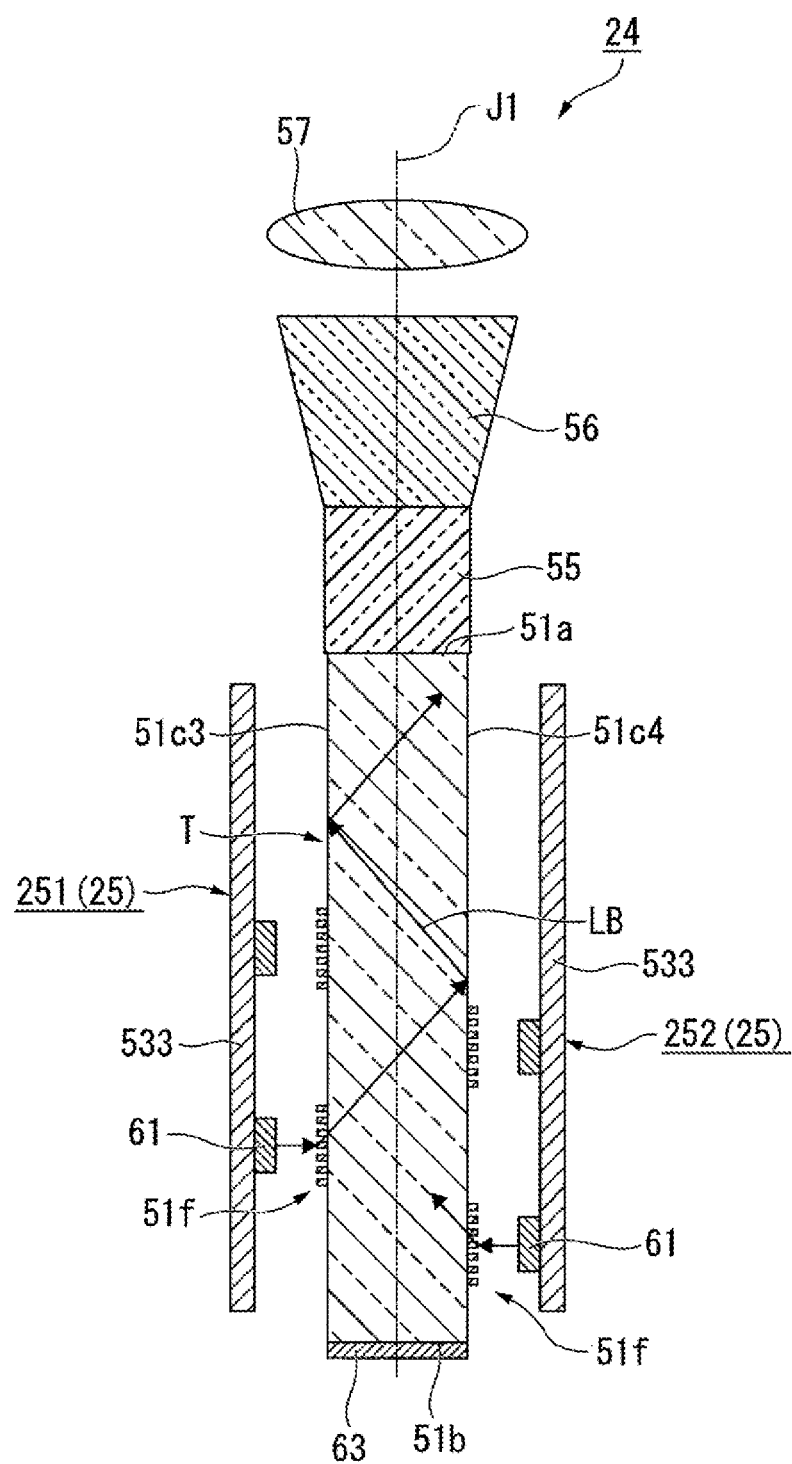
FIG. 6 is a cross-sectional view of a light source device according to a second modified example.

FIG. 6 is a cross-sectional view of a light source device 24 according to a second modified example, and corresponds to a cross-sectional view at the same position as in FIG. 3. Therefore, in FIG. 6, the constituents common to those shown in FIG. 3 are denoted by the same reference numerals, and the description thereof will be omitted.

As shown in FIG. 6, in the light source device 24 according to the second modified example, a light source 25 has a first light source 251 having the plurality of first LED 61 opposed to the side surface 51c3 of the light guide rod 51, and a second light source 252 having the plurality of LED 61 opposed to the side surface 51c4 of the light guide rod 51. It should be noted that the positions in the longitudinal direction of the light guide rod of the plurality of first LED 61 opposed to the side surface 51c3 are shifted from those of the plurality of first LED 61 opposed to the side surface 51c4, and thus, the first LED 61 opposed to the side surface 51c3 and the first LED 61 opposed to the side surface 51c4 are arranged alternately. The diffraction gratings 51f are disposed so as to correspond to the light irradiation areas of the respective first LED 61, and an area T where the diffraction grating 51f is not disposed exists between the diffraction gratings 51f adjacent to each other.

Third Modified Example

As a light source device according to a third modified example, it is also possible to share the LED in both of the light guide rod 51 and the wavelength conversion rod 58. Specifically, it is also possible to dispose the LED so as to straddle both of the light guide rod 51 and the wavelength conversion rod 58 and to be opposed to each of the rods 51, 58. The diffraction gratings are provided to the light guide rod 51 so as to correspond to the light irradiation areas of the respective LED. In this case, the light LB having entered the light guide rod 51 out of the light emitted from the LED functions as the blue light constituting the white composite light. Further, the light having entered the wavelength conversion rod 58 functions as the excitation light for exciting the phosphor. Therefore, the wavelength of the light emitted from the LED is set so as to fulfill the both functions.

Also in the light source devices according to the three modified examples described above, it is possible to efficiently use the blue light LB, and substantially the same advantages as those of the light source device 2 according to the first embodiment can be obtained.

Second Embodiment

Hereinafter, a second embodiment of the present disclosure will be described using FIG. 7.

A light source device according to the second embodiment is substantially the same in basic configuration as that of the first embodiment, but is different in the arrangement of the rods, the configuration of the prism and the light paths from that of the first embodiment. Therefore, the description of the overall configuration of the light source device will be omitted.

Figure 7:
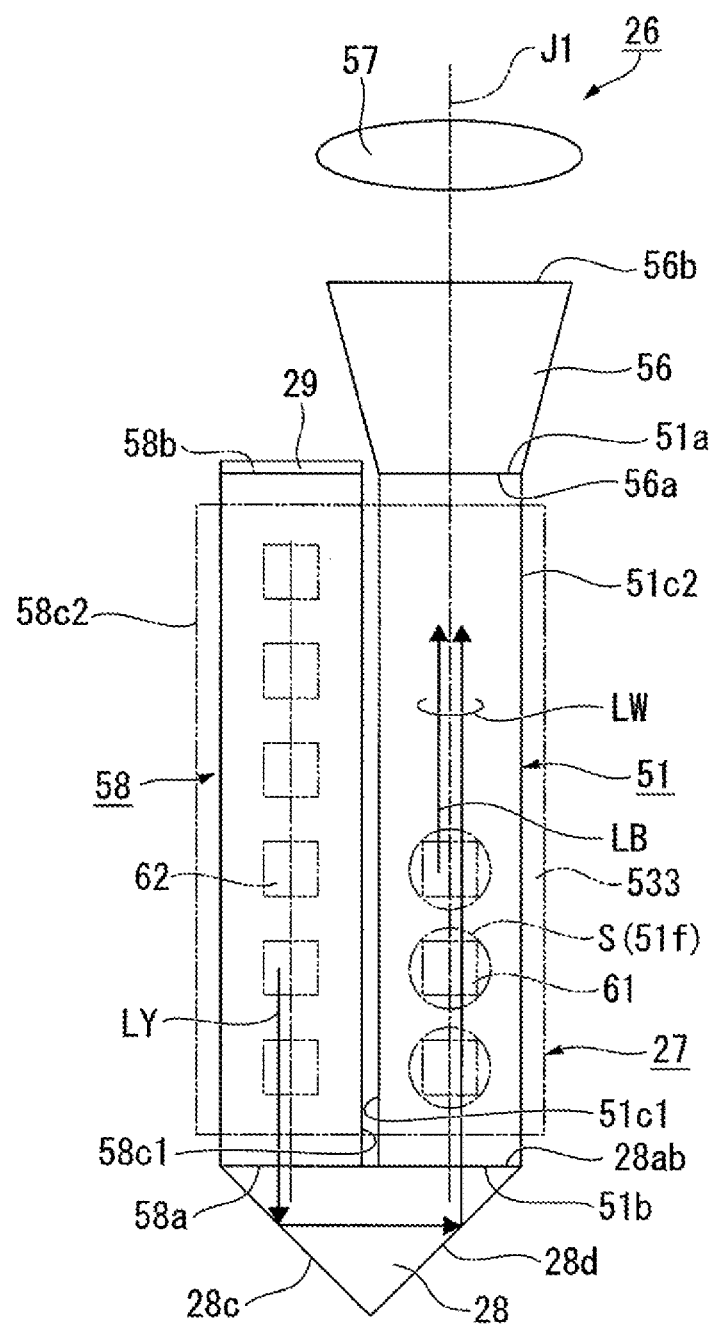
FIG. 7 is a schematic configuration diagram of a light source device according to a second embodiment.

FIG. 7 is a schematic configuration diagram of the light source device 26 according to the second embodiment.

In FIG. 7, the constituents common to those shown in FIG. 2 are denoted by the same reference numerals, and the description thereof will be omitted.

As shown in FIG. 7, the light source device 26 according to the second embodiment is provided with the light guide rod 51, the wavelength conversion rod 58, a light source 27, a prism 28 (a light guide member), the angle conversion element 56 and the collimator lens 57. The light source device 26 according to the second embodiment has the single wavelength conversion rod 58. Unlike the light source device 2 according to the first embodiment, the light source device 26 according to the second embodiment is not provided with the light combining element 55.

In the light source device 2 according to the first embodiment, the first end surface 51a of the light guide rod 51 and the third end surface 58a of the wavelength conversion rod 58 are disposed on the same side in the longitudinal direction of the rods, and the second end surface 51b of the light guide rod 51 and the fourth end surface 58b of the wavelength conversion rod 58 are disposed on the same side. In contrast, in the light source device 26 according to the second embodiment, the first end surface 51a (the light exit end surface) of the light guide rod 51 and the fourth end surface 58b of the wavelength conversion rod 58 are disposed on the same side, and the second end surface 51b of the light guide rod 51 and the third end surface 58a (the light exit end surface) of the wavelength conversion rod 58 are disposed on the same side.

The prism 28 is disposed so as to straddle the third end surface 58a of the wavelength conversion rod 58 and the second end surface 51b of the light guide rod 51. The prism 28 is formed of a prism shaped like a triangular prism having an isosceles right triangular cross-sectional shape, and has a light incidence/exit end surface 28ab, and two reflecting surfaces 28c, 28d. The prism 28 has a function of folding the light path of the fluorescence LY having entered the prism 28 at an angle of 180° and then emitting the fluorescence LY. Specifically, the prism 28 sequentially reflects the fluorescence LY having entered the prism 28 from the light incidence/exit end surface 28ab with the two reflecting surfaces 28c, 28d to thereby fold the light path at an angle of 180°, and then emits the fluorescence LY from the light incidence/exit end surface 28ab.

The wavelength conversion rod 58 has a mirror 29 (a reflecting section) disposed on the fourth end surface 58b of the wavelength conversion rod 58. The mirror 29 is formed of a metal film or a dielectric multilayer film formed on the fourth end surface 58b of the wavelength conversion rod 58.

The angle conversion element 56 is disposed on the first end surface 51a of the light guide rod 51. The angle conversion element 56 is formed of a taper rod having an end plane of incidence of light 56a which the composite light LW enters, and a light exit end surface 56b from which the composite light LW is emitted. The angle conversion element 56 is fixed to the light guide rod 51 so that the end plane of incidence of light 56a is opposed to the first end surface 51a of the light guide rod 51. Specifically, the angle conversion element 56 and the light guide rod 51 have contact with each other via an optical adhesive (not shown), and no air gap (no air layer) is disposed between the angle conversion element 56 and the light guide rod 51. It should be noted that the angle conversion element 56 can also be fixed so as to have direct contact with the light guide rod 51 by, for example, an arbitrary support member. In any case, it is desirable not to provide an air gap between the angle conversion element 56 and the light guide rod 51. It is desirable to make the refractive index of the angle conversion element 56 and the refractive index of the light guide rod 51 coincide with each other as precise as possible.

The rest of the configuration of the light source device 26 is substantially the same as in the first embodiment.

Hereinafter, the behavior of the light in the light source device 26 according to the second embodiment will be described.

When the light emitted from the second LED 62 enters the wavelength conversion rod 58, the phosphor included in the wavelength conversion rod 58 is excited, and the fluorescence LY is emitted from an arbitrary light emitting point. The fluorescence LY proceeds from the arbitrary light emitting point toward all directions, but the fluorescence LY proceeding toward the side surfaces proceeds toward the third end surface 58a or the fourth end surface 58b while repeating the total reflection by the end surfaces. The fluorescence LY having proceeded toward the third end surface 58a enters the prism 28. Meanwhile, the fluorescence LY having proceeded toward the fourth end surface 58b is reflected by the mirror 29, and then proceeds toward the third end surface 58a.

The fluorescence LY having entered the prism 28 is reflected by the reflecting surfaces 28c, 28d of the prism. 28, and thus the light path of the fluorescence LY is folded, and then the fluorescence LY enters the light guide rod 51 from the second end surface 51b.

The blue light LB having been emitted from the first LED 61 enters the light guide rod 51 via the diffraction gratings 51f. On this occasion, the light entering the light guide rod 51 with an incident angle smaller than the critical angle is diffracted by the diffraction grating 51f with a diffraction angle equal to or larger than the critical angle. Thus, the light path of the light LB having entered the light guide rod 51 is dramatically folded toward the first end surface 51a, and the light LB proceeds toward the first end surface 51a while repeating the total reflection on the side surfaces of the light guide rod 51.

Further, the fluorescence LY having entered the light guide rod 51 is guided inside the light guide rod 51 together with the light LB, and then the white composite light LW consisting of the light LB and the fluorescence LY is emitted from the first end surface 51a of the light guide rod 51. The composite light LW having been emitted from the light guide rod 51 is collimated by the angle conversion element 56 and the collimator lens 57, and is then emitted from the light source device 26. The composite light LW (the illumination light WL) having been emitted from the light source device 26 proceeds toward the integrator optical system 31 as shown in FIG. 1.

It should be noted that the light path of most of the light LB having entered the light guide rod 51 is folded by the diffraction gratings 51f, and thus the most of the light LB proceeds toward the first end surface 51a, but the light LB proceeding toward the second end surface 51b barely exists. The light path of the light LB having proceeded toward the second end surface 51b is folded by the prism 28, and thus, the light LB enters the wavelength conversion rod 58. In this case, when the light LB is used for the excitation of the phosphor, wavelength of the light LB is converted into that of the fluorescence LY, and therefore, no particular problem arises. Further, even when the light LB has not been used for the excitation of the phosphor, the light LB is reflected by the mirror 29 on the fourth end surface 58b of the wavelength conversion rod 58, and then returns again to the light guide rod 51 via the prism 28, and therefore, there arises no particular problem.

It is also possible for the dichroic mirror for reflecting the light LB and transmitting the yellow fluorescence LY to be disposed on the second end surface 51b of the light guide rod 51 or the third end surface 58a of the wavelength conversion rod 58. In that case, the light LB emitted from the first LED 61 can be prevented from entering the wavelength conversion rod 58.

Also in the second embodiment, it is possible to obtain substantially the same advantages as in the first embodiment such as the advantage that it is possible to realize the compact light source device 26 for emitting the white light, the advantage that it is possible to realize the light source device small in etendue, and the advantage that it is unnecessary to separately prepare a phosphor light source capable of emitting the blue light.

Also in the light source device 26 according to the second embodiment, it is also possible to provide the configurations of the first through third modified examples illustrated in the first embodiment. Therefore, it is also possible to share the LED in both of the light guide rod 51 and the wavelength conversion rod 58. Further, although in the present embodiment, there is used the prism 28 as the light guide member for making the light having been emitted from the wavelength conversion rod 58 enter the light guide rod 51, it is also possible to use other light guide members such as a mirror.

Third Embodiment

A third embodiment of the present disclosure will hereinafter be described using FIG. 8.

There is cited the example of the liquid crystal projector in the first embodiment, but in the third embodiment, the description will be presented citing an example of a projector equipped with a micromirror type light modulation device.

Figure 8:
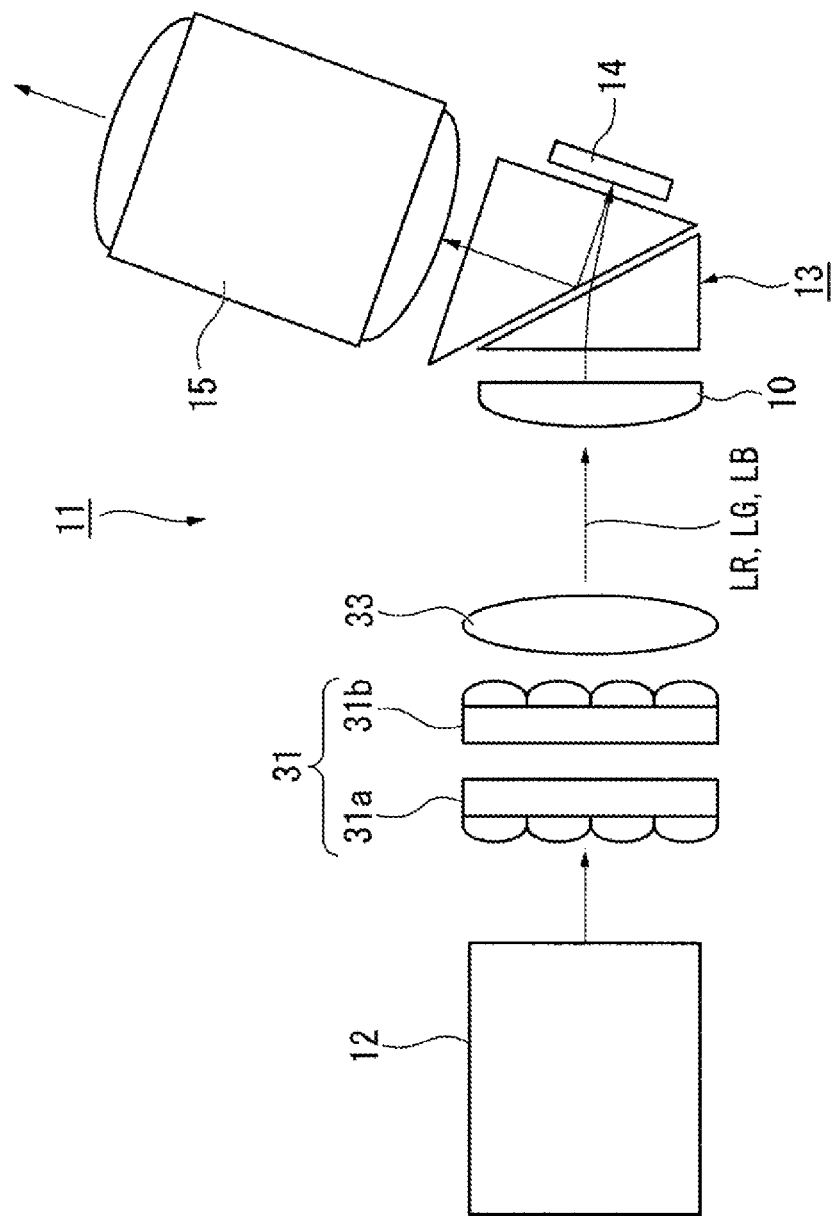
FIG. 8 is a schematic configuration diagram of a projector according to a third embodiment.

FIG. 8 is a schematic configuration diagram of the projector according to the third embodiment.

In FIG. 8, the constituents common to those shown in FIG. 1 are denoted by the same reference numerals, and the description thereof will be omitted.

As shown in FIG. 8, the projector 11 according to the third embodiment is provided with a light source device 12, an integrator optical system 31, a superimposing optical system 33, a field lens 10, a light guide optical system 13, a micromirror type light modulation device 14 and a projection optical device 15.

In the third embodiment, there is used the light source device 12 of a color sequential type for emitting the blue light, the green light and the red light in a time sharing manner. The detailed configuration of the light source device 12 will be described later.

The field lens 10 collimates the light emitted from the superimposing optical system 33. The field lens 10 is formed of a convex lens.

The light guide optical system 13 is formed of an internal total reflection prism (a TIR prism). The light guide optical system 13 transmits the red light, the green light and the blue light having been emitted from the light source device 12 to make the red light, the green light and the blue light enter the light modulation device 14 in a time sharing manner, and at the same time, totally reflects the image light emitted from the light modulation device 14 to guide the image light to the projection optical device 15.

As the micromirror type light modulation device 14, there is used, for example, a Digital Micromirror Device (DMD). The DMD has a configuration having a plurality of micromirrors arranged in a matrix. The DMD switches the tilt directions of the plurality of micromirrors to thereby switch the reflection direction of the incident light at high speed between the direction in which the incident light enters the projection optical device 15 and the direction in which the incident light fails to enter the projection optical device 15. As described above, the light modulation device 14 sequentially modulates the red light LR, the green light LG and the blue light LB having been emitted from the light source device 12 to generate a red image, a green image and a blue image.

The projection optical device 15 projects the red image, the green image and the blue image on a screen. The projection optical device 15 is constituted by, for example, a plurality of projection lenses.

The light source device 12 will hereinafter be described.

Figure 9:
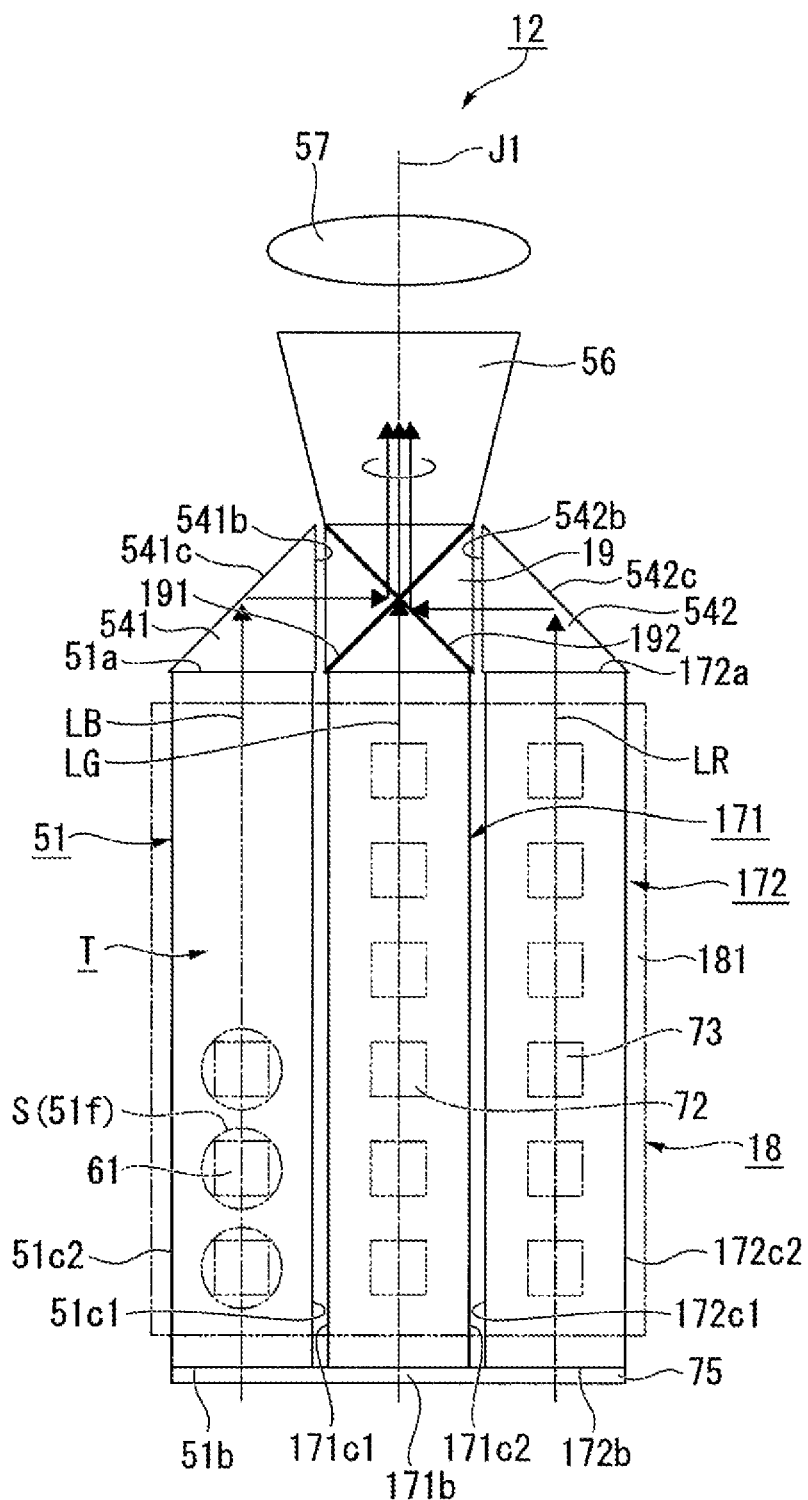
FIG. 9 is a schematic configuration diagram of a light source device according to the third embodiment.

FIG. 9 is a schematic configuration diagram of the light source device 12 according to the third embodiment.

In FIG. 9, the constituents common to those shown in FIG. 2 are denoted by the same reference numerals, and the description thereof will be omitted.

As shown in FIG. 9, the light source device 12 according to the third embodiment is provided with the light guide rod 51, a first wavelength conversion rod 171 (the wavelength conversion section), a second wavelength conversion rod 172 (a second wavelength conversion section), a light source 18, a first prism 541, a second prism 542, a light combining element 19, the angle conversion element 56 and the collimator lens 57. The light source device 12 of the second embodiment has the first wavelength conversion rod 171 for emitting the green light, and the second wavelength conversion rod 172 for emitting the red light.

The second wavelength conversion rod 172 has a shape of a quadrangular prism, and has a fifth end surface 172a and a sixth end surface 172b opposed to each other, and four side surfaces 172c1, 172c2 crossing the fifth end surface 172a and the sixth end surface 172b. The whole of the four side surfaces 172c1, 172c2 corresponds to a third side surface in the appended claims. It should be noted that only the two side surfaces 172c1, 172c2 out of the four side surfaces are denoted by the reference numerals for the sake of convenience of illustration.

The light guide rod 51 and the first wavelength conversion rod 171 are disposed at a distance in an orientation in which the side surface 51c1 of the light guide rod 51 and the side surface 171c1 of the first wavelength conversion rod 171 are opposed to each other. The first wavelength conversion rod 171 and the second wavelength conversion rod 172 are disposed at a distance in an orientation in which the side surface 171c2 of the first wavelength conversion rod 171 and the side surface 172c1 of the second wavelength conversion rod 172 are opposed to each other.

The light source 18 is provided with a substrate 181, and a plurality of light emitting diodes 61, 72 and 73 (LED) mounted on a surface of the substrate 181, the surface being opposed to the light guide rod 51, the first wavelength conversion rod 171 and the second wavelength conversion rod 172. In the present embodiment, the light source 18 is provided with the 15 LED 61, 72 and 73, but the number of the LED 61, 72 and 73 is not particularly limited. Each of the LED 61, 72 and 73 emits the first light in the first wavelength band. The first wavelength band is a blue wavelength of, for example, 400 nm through 480 nm, and the peak wavelength is, for example, 445 nm. Therefore, the first light is the blue light. It should be noted that the light source 18 can also be provided with other optical members such as a light guide plate, a diffuser plate or a lens besides the substrate 181 and the LED 61, 72 and 73.

The plurality of LED 61, 72 and 73 is disposed on the side surface of the light guide rod 51, the side surface of the first wavelength conversion rod 171 and the side surface of the second wavelength conversion rod 172, and is arranged in three columns. Some LED 61 are arranged along the longitudinal direction of the light guide rod 51. Other some LED 72 are arranged along the longitudinal direction of the first wavelength conversion rod 171. The other LED 73 are arranged along the longitudinal direction of the second wavelength conversion rod 172. In the present embodiment, the LED arranged along the longitudinal direction of the light guide rod 51 are hereinafter referred to as first LED 61. The LED arranged along the longitudinal direction of the first wavelength conversion rod 171 are referred to as second LED 72. The LED arranged along the longitudinal direction of the second wavelength conversion rod 172 are referred to as third LED 73.

The light emitted from the first LED 61 propagates inside the light guide rod 51, and is then emitted from the light guide rod 51, and functions as the blue light constituting a part of the illumination light. Further, the light emitted from the second LED 72 enters the first wavelength conversion rod 171, and functions as the excitation light for exciting the phosphor in the first wavelength conversion rod 171. The light emitted from the third LED 73 enters the second wavelength conversion rod 172, and functions as the excitation light for exciting the phosphor in the second wavelength conversion rod 172.

As described above, since the light emitted from the first LED 61, the light emitted from the second LED 72 and the light emitted from the third LED 73 are different in function from each other, it is possible for the first LED 61, the second LED 72 and the third LED 73 to emit light beams having the wavelengths different from each other so as to be optimized as the blue light and the excitation light, respectively, or emit light beams having the same wavelength used commonly to the both functions.

The first wavelength conversion rod 171 converts the light (other partial light out of the first light) emitted from the second LED 72 into fluorescence LG (second light) in a second wavelength band different from the first wavelength band (the blue wavelength band). The second wavelength band is a green wavelength band of, for example, 500 through 570 nm.

Therefore, the second light is green fluorescence.

Specifically, the first wavelength conversion rod 171 is formed of a green phosphor material such as a $Lu_3Al_5O_{12}$:$Ce^{3+}$ phosphor, a $Y_3O_4$:$Eu^{2+}$ phosphor, a $(Ba, Sr)_2SiO_4$:$Eu^{2+}$ phosphor, a $Ba_3Si_6O_{12}N_2$:$Eu^{2+}$ phosphor or a $(Si,Al)_6(O,N)_8$:$Eu^{2+}$ phosphor.

The second wavelength conversion rod 172 converts the light (other partial light out of the first light) emitted from the third LED 73 into fluorescence LR (third light) in a third wavelength band different from the first wavelength band (the blue wavelength band) and the second wavelength band (the green wavelength band). The third wavelength band is a red wavelength band of, for example, 600 through 800 nm. Therefore, the third light is red fluorescence. Specifically, the second wavelength conversion rod 172 is formed of, for example, the YAG phosphor (any one of Pr:YAG, Eu:YAG and Cr:YAG) made of $(Y_{1-x},Gd_x)_3(Al, Ga)_5O_{12}$ having any one of Pr, Eu and Cr dispersed as an activator agent. It should be noted that it is possible for the activator agent to include a species selected from Pr, Eu and Cr, or to be a coactivation type activator agent including two or more species selected from Pr, Eu and Cr.

The light guide rod 51 has a mirror 75 (a first reflecting section) disposed on the second end surface 51*b* of the light guide rod 51. The first wavelength conversion rod 171 has the mirror 75 (a second reflecting section) disposed on the fourth end surface 171*b* of the first wavelength conversion rod 171. The second wavelength conversion rod 172 has the mirror 75 (a third reflecting section) disposed on the sixth end surface 172*b* of the second wavelength conversion rod 172. In the present embodiment, the mirror 75 common to all of the light guide rod 51, the first wavelength conversion rod 171 and the second wavelength conversion rod 172 is disposed as shown in FIG. 9, but the mirror 75 can also be provided individually to each of the rods. The mirror 75 is formed of a metal film or a dielectric multilayer film formed on the end surface of each of the rods.

The first prism 541 is disposed on the first end surface 51*a* of the light guide rod 51. The first prism 541 reflects the blue light LB, which has been emitted from the first end surface 51*a* of the light guide rod 51, with a reflecting surface 541*c* to thereby fold the light path at an angle of 90°, and then emits the blue light LB from a light exit end surface 541*b*. The second prism 542 is disposed on the fifth end surface 172*a* of the second wavelength conversion rod 172. The second prism 542 reflects the red light LR, which has been emitted from the fifth end surface 172*a* of the second wavelength conversion rod 172 with a reflecting surface 542*c* to thereby fold the light path at an angle of 90°, and then emits the red light LR from a light exit end surface 542*b*.

The light combining element 19 is disposed so as to be opposed to the light exit end surface 541*b* of the first prism 541, the light exit end surface 542*b* and the third end surface 171*a* of the first wavelength conversion rod 171. The light combining element 19 is formed of a dichroic prism having a first dichroic mirror 191 and a second dichroic mirror 192 so as to cross each other. The first dichroic mirror 191 has a characteristic of reflecting light in the blue wavelength band while transmitting light in the green wavelength band and light in the red wavelength band. The second dichroic mirror 192 has a characteristic of reflecting the light in the red wavelength band while transmitting light in the blue wavelength band and the light in the green wavelength band. Thus, the light combining element 19 combines the blue light LB emitted from the light guide rod 51, the green light LG emitted from the first wavelength conversion rod 171 and the red light LR emitted from the second wavelength conversion rod 172 with each other.

In the light source device 12 according to the third embodiment, the first LED 61, the second LED 72 and the third LED 73 light in a time sequential manner. Therefore, in the lighting period of the first LED 61, the blue light LB emitted from the first LED 61 enters the light guide rod 51 via the diffraction gratings 51*f,* propagates inside the light guide rod 51, then enters the light combining element 19 via the first prism 541, and is then reflected by the first dielectric mirror 191, and then emitted from the light source device 12 via the angle conversion element 56 and the collimator lens 57.

In the lighting period of the second LED 72, the light emitted from the second LED 72 enters the first wavelength conversion rod 171, and excites the phosphor included in the first wavelength conversion rod 171 to generate the green light LG. The green light LG propagates inside the first wavelength conversion rod 171, and then enters the light combining element 19, and is then transmitted through the first dichroic mirror 191 and the second dichroic mirror 192, and then emitted from the light source device 12 via the angle conversion element 56 and the collimator lens 57.

In the lighting period of the third LED 73, the light emitted from the third LED 73 enters the second wavelength conversion rod 172, and excites the phosphor included in the second wavelength conversion rod 172 to generate the red light LR. The red light LR propagates inside the second wavelength conversion rod 172, and then enters the light combining element 19 via the second prism 542, and is then reflected by the second dichroic mirror 192, and then emitted from the light source device 12 via the angle conversion element 56 and the collimator lens 57.

Although in the light source device 12 according to the third embodiment, totally three rods 51, 171 and 172 are used, the rods 51, 171 and 172 are disposed so that the side surfaces are opposed to each other, and the light source 18 is disposed so as to be opposed to other side surfaces, and therefore, it is possible to realize the compact light source device 12 capable of emitting the blue light LB, the green light LG and the red light LR in a time sharing manner. Further, it is possible to obtain substantially the same advantages in the first embodiment such as the advantage that it is possible to realize the light source device 12 small in etendue, or the advantage that it is unnecessary to separately prepare a phosphor light source capable of emitting the blue light.

The projector 11 according to the present embodiment is equipped with the light source device 12 exerting the advantages described above, and is therefore excellent in light use efficiency, and at the same time, reduction is size can be achieved.

It is possible for the light guide rod 51 and the light source 18 in the light source device 12 according to the third embodiment to have the configurations of the first and second modified examples illustrated in the first embodiment.

It should be noted that although in the third embodiment, there is cited the example of the light source device 12 which lights the three colored light beams, namely the blue light LB, the green light LG and the red light LR, in a time sharing manner, it is also possible to use the same configuration as the light source which obtain the white light by lighting the blue light, the green light and the red light at the same time and then combining the blue light, the green light and the red light with each other. In that case, it is possible to use the light source device according to the present embodiment for such a three-panel type liquid crystal projector as shown in FIG. 1.

It should be noted that the scope of the present disclosure is not limited to the embodiments described above, but a variety of modifications can be provided thereto within the scope or the spirit of the present disclosure.

For example, there is cited the example in which the wavelength conversion rod includes the phosphor for emitting the yellow fluorescence in the first embodiment described above, it is also possible for the wavelength conversion rod to include two types of phosphor constituted by the phosphor for emitting the green fluorescence and the phosphor for emitting the red fluorescence. In that case, it is possible for the two types of phosphor to be homogenously mixed inside the wavelength conversion rod, or to be eccentrically located in separate areas.

Although in the embodiments described above, there is cited the example of the light source device for emitting the white light, the present disclosure can also be applied to a light source device for emitting other colored light than the white light. For example, it is also possible to configure a light source device which is provided with the light source rod and a wavelength conversion rod for emitting red light, and emits yellow light. Even in the case, according to the present disclosure, it is possible to realize a compact light source device for emitting the yellow light.

Although in the first embodiment described above, there is provided the example of applying the dichroic prism as the light combining element, it is also possible to apply other optical members capable of performing light combination. For example, a scattering body having a light scattering structure inside can also be applied as the light combining element. As an example of the scattering body, there can be cited glass including scattering particles, an optical member including an anisotropic scattering layer, and so on.

Further, the specific configurations such as the shape, the number, the arrangement, the material of each of the constituents constituting the light source device are not limited to those of the embodiments described above, but can arbitrarily be modified.

Although in the first embodiment described above, there is described an example when applying the present disclosure to the transmissive liquid crystal projector, it is also possible to apply the present disclosure to a reflective projector. Here, "transmissive" denotes that the liquid crystal light valve including the liquid crystal panel and so on has a configuration of transmitting the light. The term "reflective" denotes that the liquid crystal light valve has a configuration of reflecting the light.

Although in the first embodiment described above, there is cited the example of the projector using three liquid crystal panels, the present disclosure can also be applied to a projector using one liquid crystal panel alone or a projector using four or more liquid crystal panels.

Although in the embodiments described above, there is described the example of installing the light source device according to the present disclosure in the projector, this is not a limitation. The light source device according to the present disclosure can also be applied to lighting equipment, a headlight of a vehicle, and so on.

What is claimed is:

1. A light source device comprising:
   a light source configured to emit first light in a first wavelength band;
   a light guide section which partial light of the first light emitted from the light source enters, and which guides the partial light; and
   a wavelength conversion section which includes a phosphor, which other partial light of the first light emitted from the light source enters, and which converts the other partial light into second light in a second wavelength band different from the first wavelength band, wherein
   the light guide section has a first end surface and a second end surface opposed to each other, and a first side surface crossing the first end surface and the second end surface,
   the wavelength conversion section has a third end surface and a fourth end surface opposed to each other, and a second side surface crossing the third end surface and the fourth end surface,
   the first side surface of the light guide section and the second side surface of the wavelength conversion section are disposed so as to be opposed to each other,
   the first side surface is provided with a diffraction grating,
   the partial light enters the light guide section from the first side surface via the diffraction grating,
   the other partial light enters the wavelength conversion section from the second side surface, and
   the partial light and the second light are emitted in one of a normal direction of the first end surface of the light guide section and a normal direction of the third end surface of the wavelength conversion section.

2. The light source device according to claim 1, wherein the partial light entering the light guide section with an incident angle smaller than a critical angle is diffracted by the diffraction grating with a diffraction angle no smaller than the critical angle.

3. The light source device according to claim 1, wherein the light source includes
   a first light emitting diode which is disposed so as to be opposed to the first side surface of the light guide section, and which emits the partial light, and
   a second light emitting diode which is disposed so as to be opposed to the second side surface of the wavelength conversion section, and which emits the other partial light.

4. The light source device according to claim 3, wherein the diffraction grating is disposed at a position opposed to a light irradiation area of the first light emitting diode in the first side surface of the light guide section.

5. The light source device according to claim 4, wherein the diffraction grating fails to be disposed in an area between the light irradiation area and the first end surface in the first side surface of the light guide section.

6. The light source device according to claim 1, further comprising:
   a light combining element, wherein
   the light guide section has a first reflection section provided to the second end surface, the wavelength conversion section has a second reflection section provided to the fourth end surface, the light combining element combines the partial light emitted from the first end surface of the light guide section and the second light emitted from the third end surface of the wavelength conversion section with each other, and the partial light and the second light are emitted from the light combining element.

7. The light source device according to claim 1, further comprising:

a light guide member, wherein the wavelength conversion section has a reflection section provided to the third end surface, the light guide member is disposed so as to be opposed to the fourth end surface of the wavelength conversion section and the second end surface of the light guide section, and guides at least the second light emitted from the fourth end surface of the wavelength conversion section to the second end surface of the light guide section, and the partial light and the second light are emitted from the first end surface of the light guide section.

8. The light source device according to claim 1, wherein the first wavelength band is a blue wavelength band, and the second wavelength band is a yellow wavelength band.

9. The light source device according to claim 1, further comprising:

a second wavelength conversion section which has a fifth end surface and a sixth end surface opposed to each other, and a third side surface crossing the fifth end surface and the sixth end surface, and which converts the other partial light into third light in a third wavelength band different from the first wavelength band and the second wavelength band; and a light combining element configured to combine the partial light emitted from the first surface of the light guide section, the second light emitted from the third end surface of the wavelength conversion section, and the third light emitted from the fifth end surface of the second wavelength conversion section with each other, wherein the light guide section has a first reflection section provided to the second end surface, the wavelength conversion section has a second reflection section provided to the fourth end surface, the second wavelength conversion section has a third reflection section provided to the sixth end surface, and the partial light, the second light and the third light are emitted from the light combining element.

10. The light source device according to claim 9, wherein the first wavelength band is a blue wavelength band, the second wavelength band is a green wavelength band, and the third wavelength band is a red wavelength band.

11. A projector comprising:

the light source device according to claim 1;

a light modulation device configured to modulate light from the light source device in accordance with image information; and a projection optical device configured to project the light modulated by the light modulation device.

* * * * *